(12) United States Patent
Sakashita (10) Patent No.: US 8,828,524 B2
(45) Date of Patent: Sep. 9, 2014

(54) LAYERED STRUCTURE AND PIEZOELECTRIC DEVICE USING THE SAME

(75) Inventor: Yukio Sakashita, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 494 days.

(21) Appl. No.: 13/041,011

(22) Filed: Mar. 4, 2011

(65) Prior Publication Data

US 2011/0217519 A1 Sep. 8, 2011

(30) Foreign Application Priority Data

Mar. 4, 2010 (JP) ................................ 2010-047472

(51) Int. Cl.
- *B32B 3/10* (2006.01)
- *H01L 41/45* (2013.01)
- *G03F 7/20* (2006.01)
- *B32B 9/00* (2006.01)

(52) U.S. Cl.
CPC . *B32B 3/10* (2013.01); *H01L 41/45* (2013.01); *G03F 7/20* (2013.01); *B32B 9/00* (2013.01)
USPC ........ 428/206; 428/195.1; 428/201; 428/208; 310/311

(58) Field of Classification Search
USPC ................ 428/195.1, 201, 206, 208; 310/311
See application file for complete search history.

(56) References Cited

U.S. PATENT DOCUMENTS

| | | | |
|---|---|---|---|
| 5,846,505 A * | 12/1998 | Saegusa | 423/263 |
| 6,931,700 B2 | 8/2005 | Uchiyama | |
| 7,845,767 B2 | 12/2010 | Sakashita et al. | |
| 2001/0009345 A1 | 7/2001 | Chang et al. | |
| 2002/0132897 A1 | 9/2002 | Xu et al. | |
| 2007/0236104 A1 * | 10/2007 | Fujii | 310/358 |
| 2007/0241642 A1 | 10/2007 | Miyazawa et al. | |
| 2008/0074471 A1 * | 3/2008 | Sakashita et al. | 347/68 |
| 2010/0068460 A1 | 3/2010 | Moriyama et al. | |
| 2010/0103226 A1 | 4/2010 | Sakashita et al. | |

FOREIGN PATENT DOCUMENTS

| | | |
|---|---|---|
| JP | 2000-124516 A | 4/2000 |
| JP | 2001-53347 A | 2/2001 |
| JP | 2001-250992 A | 9/2001 |
| JP | 2002-201068 A | 7/2002 |
| JP | 2003-179282 A | 6/2003 |
| JP | 2007-287745 A | 11/2007 |
| JP | 2008-195603 A | 8/2008 |

OTHER PUBLICATIONS

"Ceramic Composite, Chapter 2 Ceramic-Plastic Composite Piezoelectric Body", Ceramic Society of Japan, published by Baifukan Co., Ltd.

Hosono et al., "High-Efficiency Piezoelectric Single Crystals", Toshiba Review, 2004, vol. 59, No. 10, p. 41.

(Continued)

*Primary Examiner* — Gerard Higgins
*Assistant Examiner* — Christopher Polley
(74) *Attorney, Agent, or Firm* — Birch, Stewart, Kolasch & Birch, LLP (57) ABSTRACT

A layered structure, including a flexible resin substrate and a composite piezoelectric film formed on the resin substrate and constituted by an organic polymer resin matrix and a plurality of inorganic piezoelectric bodies dispersed in the matrix.

8 Claims, 7 Drawing Sheets

(56) References Cited

OTHER PUBLICATIONS

Itaru Yamamoto, "Ceramic-Plastic Composite Piezoelectric Body", Ceramic Composite, Chapter 2, Ceramic Society of Japan, published by Baifukan Co., Ltd, May 10, 1989, pp. 39-62.

Japanese Office Action dated Nov. 19, 2013, issued in corresponding Japanese Patent Application No. 2010-047472.

Japanese Office Action dated Mar. 4, 2014 for corresponding Japanese Application No. 2010-047472 with English translation.

* cited by examiner

× NON-LEAD CERAMICS, 2-4 SYSTEM
◇ NON-LEAD CERAMICS, 1-5 SYSTEM
◆ NON-LEAD FILM
○ LEAD BASED CERAMICS
× LEAD BASED FILM
▲ $(Ba_{0.22}Bi_{0.78})(Ti_{0.17}Fe_{0.79}Mn_{0.04})O_3$
△ $(Ba_{0.22}Bi_{0.78})(Ti_{0.17}Fe_{0.79}Mn_{0.04})O_3$
▼ $(Ba_{0.3}Bi_{0.7})(Ti_{0.29}Fe_{0.66}Mn_{0.05})O_3$
▽ $(Ba_{0.3}Bi_{0.7})(Ti_{0.29}Fe_{0.66}Mn_{0.05})O_3$
⊙ $(Ba_{0.15}Bi_{0.8}Sr_{0.05})(Ti_{0.19}Fe_{0.76}Mn_{0.05})O_3$
⊚ $(Ba_{0.15}Bi_{0.8}Sr_{0.05})(Ti_{0.19}Fe_{0.76}Mn_{0.05})O_3$
▣ $(Ba_{0.2}Bi_{0.8})(Ti_{0.15}Fe_{0.75}Nb_{0.05}Mn_{0.05})O_3$
▩ $(Ba_{0.2}Bi_{0.8})(Ti_{0.15}Fe_{0.75}Nb_{0.05}Mn_{0.05})O_3$

LAYERED STRUCTURE AND PIEZOELECTRIC DEVICE USING THE SAME

BACKGROUND OF THE INVENTION

1. Field of the Invention

The present invention relates to a layered structure suitable for use with sensor arrays a piezoelectric body, such as infrared sensors, ultrasonic sensors, and pressure sensors, actuator arrays, patterned memories, and the like. The invention also relates to a piezoelectric device using the layered structure.

2. Description of the Related Art

For I/O devices, small and light weight wearable devices are desired for portable use and ambient devices that fit in the environment are desired for stationary use in order to achieve the goal of realizing a ubiquitous society. From the viewpoint of ease of use and safety, it is important that these devices are "light weighted, not easily broken, and flexible". Consequently, a trend towards flexibilization in various devices has recently been accelerated.

Whereas the flexibilization in the field of displays and electronic papers in wearable and ambient device configurations is moving forward steadily, the flexibilization of devices that use a piezoelectric material, such as various types of sensors, actuators, memories, and the like, is making little progress due to the fact that high temperature film forming of 600° C. or more is generally required for the manufacture of an inorganic piezoelectric material having excellent piezoelectricity and thereby a high heatproof temperature is required for the flexible substrates.

For piezoelectric materials that do not require high temperature film forming, piezoelectric polymers in which the piezoelectric substance itself has piezoelectricity as typified by polyVinylidene difluoride (PVDF) are known as described, for example, in U.S. Patent Application Publication No. 20100068460. The piezoelectric polymers, however, have a small piezoelectric d constant in comparison with inorganic piezoelectric materials, and therefore, they are limited to certain applications, such as pressure sensors and the like, that do not require a high piezoelectric performance.

Further, an attempt has been made in which a piezoelectric device is formed on a device forming substrate using a piezoelectric material which has high piezoelectricity, then the device forming substrate is removed by etching, and the piezoelectric device is bonded to a flexible substrate as described, for example, in claim 11 of Japanese Unexamined Patent Publication No. 2003-179282.

As described in Japanese Unexamined Patent Publication No. 2003-179282, it is necessary to use an adhesive when a thin film piezoelectric material is bonded to a flexible substrate. As a thin film piezoelectric material having a lower electrode layer formed on the bonding surface with a flexible substrate is actually used, the bonding using an adhesive may possibly result in that the adhesive hinders favorable contact between the piezoelectric film and electrode. Where the flexible substrate is a resin substrate, the piezoelectric film can not follow the deformation of the substrate due to differences in the rigidity and modulus of elasticity, whereby the piezoelectric film may have a crack or the piezoelectric film may be peeled off due to detachment of the adhesive.

The present invention has been developed in view of the circumstances described above, and it is an object of the present invention to provide a layered structure which includes a piezoelectric film that shows an excellent piezoelectric performance and can be applied favorably to flexible piezoelectric devices. It is a further object of the present invention to provide a flexible piezoelectric device using the layered structure.

SUMMARY OF THE INVENTION

A layered structure of the present invention is a structure, including:

a resin substrate; and a composite piezoelectric film formed on the substrate and constituted by an organic polymer resin matrix and a plurality of inorganic piezoelectric bodies dispersed in the matrix.

The term "composite piezoelectric film" as used herein refers to a composite film of a polymer matrix and a piezoelectric body ("Ceramic Composite, Chapter 2 Ceramic-Plastic Composite Piezoelectric Body", Ceramic Society of Japan, published by Baifukan Co., Ltd).

In the layered structure of the present invention, it is preferable that the organic polymer resin is a resin having photosensitivity which, when the resin is subjected to exposure, causes an exposed portion of the resin to be denatured and turned into a resin having solubility or non-solubility to a predetermined liquid.

In the layered structure of the present invention, it is preferable that the inorganic piezoelectric body is formed of a perovskite oxide (which may include an unavoidable impurity) having a composition represented by General Formula (PX) below.

$$(Bi_x, A_{1-x})(B_y, C_{1-y})O_3 \tag{PX}$$

(where, A is an A-site element, other than Pb, having an average ionic valence of two, B is a B-site element with an average ionic valence of three, C is a B-site element with an average ionic valence of greater than three, in which each of A, B, C is one or a plurality of kinds of metal elements. O represents oxygen. B and C have different compositions. $0.6 \le x \le 1.0$, $x-0.2 \le y \le x$. Although the ratio of a total mole number of the A-site element or of the B-site element to a mole number of the oxygen atoms is normally 1:3, the ratio may deviate from 1:3 within a range in which a perovskite structure can be obtained.) In General Formula (PX) above, it is preferable that the A-site element A is at least one kind of metal element selected from the group consisting of Mg, Ca, Sr, Ba, (Na, Bi), and (K, Bi), and B-site element B is at least one kind of metal element selected from the group consisting of Al, Sc, Cr, Mn, Fe, Co, Ni, Cu, Ga, Y, In, and Re (rare earth element).

Here, each of the representations of (Na, Bi) and (K, Bi) indicates a combination of two kinds of elements in the parentheses with an average ionic valence of two. In each case, the combination is prepared by blending, in equal mole percentage, Na or K with an ionic valence of one and Bi with an ionic valence of three, so that the average ionic valence becomes two.

In the layered structure of the present invention, it is preferable that a piezoelectric strain constant $d_{33}$ (pm/V) and a relative permittivity $\epsilon_{33}$ of the inorganic piezoelectric body satisfy Formulae (1) and (2) below, and it is more preferable that the piezoelectric strain constant $d_{33}$ and the relative permittivity $\epsilon_{33}$ of the inorganic piezoelectric body satisfy Formulae (3) and (4) below.

$$100 < \epsilon_{33} < 1500 \tag{1}$$

$$d_{33} \text{ (pm/V)} > 12\sqrt{\epsilon_{33}} \tag{2}$$

$$100 < d_{33} \text{ (pm/V)} \tag{3}$$

$$80 < g_{33} (\times 10^{-3} \text{ V·m/N}) \tag{4}$$

where, the first and second subscripts in $d_{33}$ and $\epsilon_{33}$ indicate an electric field application direction and a strain direction respectively when three orthogonal axes 1, 2, and 3 are defined, thereby indicating a longitudinal vibration mode in which a strain or stress extracting direction is parallel to the electric field application direction. Accordingly, $d_{33}$ and $\epsilon_{33}$ are piezoelectric strain constant and permittivity in the longitudinal vibration mode. Preferably, the perovskite oxide includes $BaTiO_3$ as a first component and $BiFeO_3$ as a second component. Further, the perovskite oxide represented by General Formula (PX) includes a first component with a tolerance factor of greater than 1.0 and a second component with a tolerance factor of smaller than 1.0, and satisfies Formula (5) below.

$$0.97 \leq TF(PX) \leq 1.02 \tag{5}$$

(where, TF(PX) is a tolerance factor of the perovskite oxide represented by General Formula (PX) above.) In the layered structure of the present invention, it is preferable that a difference $|M_A-M_B|$ between an average atomic weight $M_A$ of the A-site elements and an average atomic weight $M_B$ of the B-site elements is greater than 145.

In the layered structure of the present invention, it is preferable that the composite piezoelectric film constitutes at least a portion of each of a plurality of protrusions formed protruding from a substrate surface of the substrate.

A piezoelectric device of the present invention includes the layered structure of the present invention described above.

A method of manufacturing a layered structure of the present invention is a method, including the steps of:

providing a resin substrate;

applying an application liquid which includes an organic polymer resin and a plurality of inorganic piezoelectric bodies dispersed in the resin and forming a composite piezoelectric film on the substrate; and patterning at least the composite piezoelectric film into a predetermined pattern.

In the method described above, it is preferable that the organic polymer resin is a resin having photosensitivity which, when the resin is subjected to exposure, causes an exposed portion of the resin to be denatured and turned into a resin having solubility or non-solubility to a predetermined liquid, and the patterning is performed by exposing the photosensitive resin and forming the predetermined pattern.

The layered structure of the present invention includes a composite piezoelectric film formed on a resin substrate and constituted by an organic polymer resin matrix and a plurality of inorganic piezoelectric bodies dispersed in the matrix. As such configuration includes, as the piezoelectric film, a composite piezoelectric film constituted by a flexible organic polymer resin and inorganic piezoelectric bodies that show an excellent piezoelectric performance dispersed in the resin, the layered structure of the present invention may provide a flexible piezoelectric device with an excellent piezoelectric performance.

Further, the layered structure of the present invention may be obtained by forming a piezoelectric film on a resin substrate without using an adhesive, and each of the substrate and piezoelectric film include a resin, so that detachment or cracking due to an external force, such as bending, is unlikely to occur in the piezoelectric film. Consequently, the layered structure of the present invention may provide a highly reliable piezoelectric device.

Still further, when a configuration is adopted in which a photosensitive resin, such as a photoresist resin, is used as the organic polymer resin, high definition patterning can be achieved. Thus, in the manufacture of an arrayed device, such as a sensor array or the like, a high definition array can be realized, whereby a high performance flexible arrayed piezoelectric device with little cross-talk may be provided. Further, in the case of a configuration in which a piezoelectric body formed of a pervskite oxide (which may include an unavoidable impurity) having a composition represented by General Formula (PX) above is used, as the inorganic piezoelectric body, a non-lead based flexible piezoelectric device excellent in piezoelectric performance and thermal stability at room temperature may be provided.

DESCRIPTION OF THE PREFERRED EMBODIMENTS

[Layered Structure, Piezoelectric Device]

Figure 1:
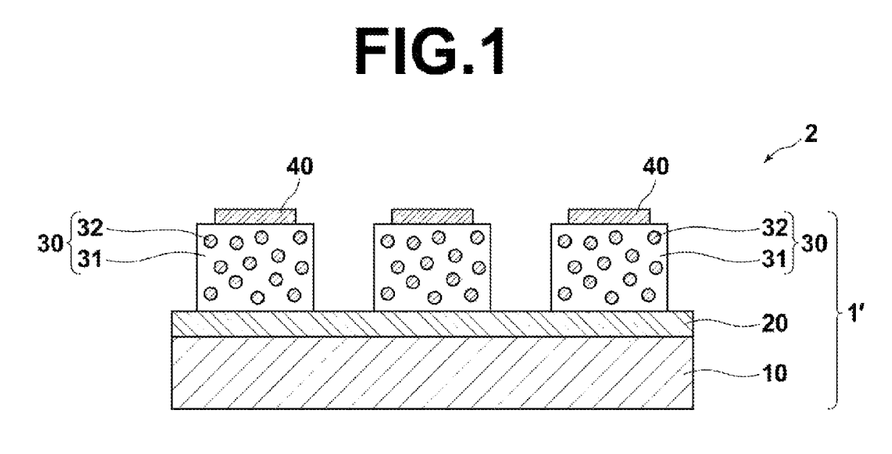
FIG. 1 is a cross-sectional view of a piezoelectric device and layered structure according to an embodiment of the present invention taken along a thickness direction, illustrating a configuration thereof.

A piezoelectric device according to an embodiment of the present invention will be described with reference to the accompanying drawings. FIG. 1 is a cross-sectional view of the piezoelectric device (piezoelectric element) according to the present embodiment taken along a thickness direction. Each of the components is not necessarily drawn to scale for facilitating visibility.

As illustrated in FIG. 1, piezoelectric device (piezoelectric element) 2 includes layered structure 1', which includes resin substrate 10 on which lower electrode layer 20 and patterned composite piezoelectric film 30 are layered in this order, and upper electrode 40 formed on each element of patterned composite piezoelectric film 30.

There is not any specific restriction on the method of patterning composite piezoelectric film 30 into layered structure 1'. Methods that can be used for the patterning include direct writing methods, such as a photolithography method, a printing method, an inkjet method, and the like, and the photolithography method is preferably used as it allows high definition patterning.

Figure 2:
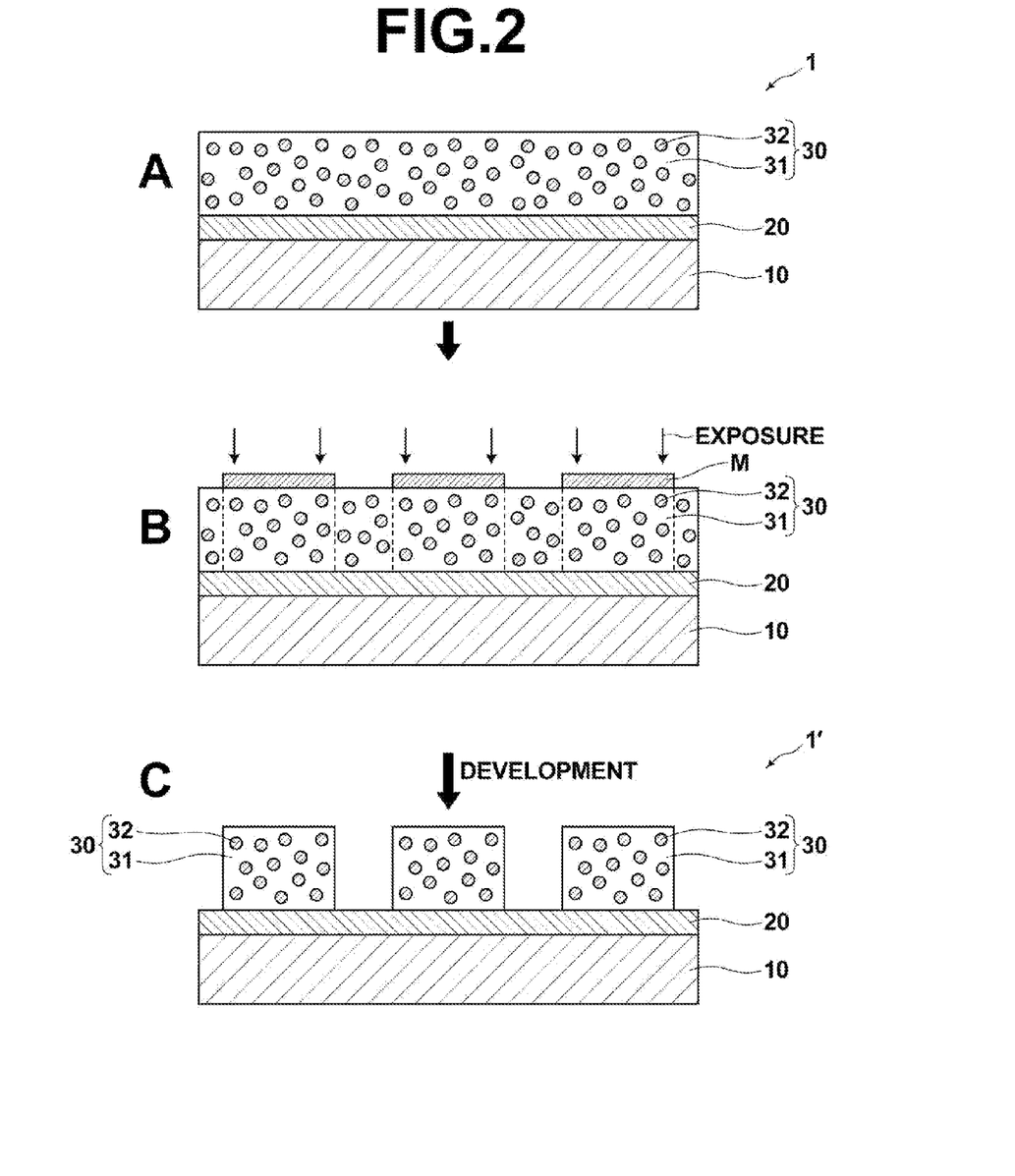
FIG. 2 is a process chart illustrating an exposure patterning process of a layered structure according to an embodiment of the present invention.

When the patterning is performed by the photolithography method, layered structure 1, which includes resin substrate 10 on which lower electrode layer 20 and composite piezoelectric film 30 are solidly formed (A of FIG. 2), is provided first, then mask M is placed on composite piezoelectric film 30 according to the patterning shape, and layered structure 1 is exposed from above (B of FIG. 2).

Thereafter, exposed composite piezoelectric film 30 is processed by a method which is in accordance with the solubility of composite piezoelectric film 30, whereby patterned layered structure 1' may be obtained (C of FIG. 2). A composition of composite piezoelectric film 30 which is suitable for the photolithography will be described later.

As for resin substrate 10, any flexible resin substrate may be used, and a resin substrate with a thickness of 500 μm is preferably used.

Materials of resin substrate 10 include polyimide, PTFE, polyethylene naphthalate, polypropylene, polystyrene, polycarbonate, polysulfone, polyarylate, polyamide, and the like, and a certain material may be selected from those described above according to the heat resistance and hydroscopic property in view of the usage environment. Further, resin substrate 10 may be a composite resin substrate which includes the resin substrate described above and silicon oxide particles, metal nanoparticles, inorganic oxide nanoparticles, inorganic nitride nanoparticles, or metal/inorganic nanofibers or microfibers.

There is not any specific restriction on the material of lower electrode 20 and upper electrode 40 as long as it is capable of favorably extracting electric charges generated in composite piezoelectric film 30. For example, Sn, Al, Ni, Pt, Au, Ag, Cu, Cr, Mo, and the like may be used. There is not any specific restriction on the film thickness of lower electrode 20 and upper electrode 40, as in substrate 10, as long as it does not compromise the flexibility of the piezoelectric composite and, for example, a film thickness of not greater than 30 μm is preferable. Such electrodes may be formed by vapor phase film forming methods, such as vacuum deposition, sputtering, and the like, coating methods, printing methods, such as screen printing, ink-jetting, and the like, or metal foil bonding.

Composite piezoelectric film 30 is a film formed of an organic polymer resin matrix 31 and a plurality of powder or particle state inorganic piezoelectric bodies 32 dispersed in the matrix. Composite piezoelectric film 30 is a piezoelectric film that makes full use of the characteristics unique to the polymer material, such as flexibility, impact resistance, workability, allowable of large area film forming, and an excellent piezoelectric performance (d constant) of the inorganic piezoelectric bodies. Composite piezoelectric film 30 has a high power output constant (piezoelectric g constant) in comparison with an inorganic piezoelectric material and is expected to be applied to various sensors and ultrasonic probes, ultrasonic transducers and dampers, such as hydrophones and the like, and vibration power generation.

There is not any specific restriction on the material of matrix 31 as long as it is an organic polymer resin. For example, general purpose plastics, such as polyethylene, polypropylene, polyvinyl chloride, polystyrene, polytetrafluoroethylene (PTFE), ABS resin (acrylonitrile butadiene styrene resin), acrylic resin, and the like, engineering plastics, such as thermoplastic polyimide and the like, synthetic rubbers, such as acrylic rubber, acrylonitrile butadiene rubber, isoprene rubber, urethane rubber, butadiene rubber, silicone rubber, and the like, piezoelectric polymers, such as polyvinylidene fluoride (PVDF), copolymer thereof, and the like, and thermosetting resins, such as phenol resin, epoxy resin, melamine resin, polyimide, and the like. A material having a favorable physical property may be selected for matrix 31 according to the intended use of piezoelectric device 2 and manufacturing method, and a material having a good bonding property with inorganic piezoelectric body 32 is preferably used.

As described above, when layered structure 1' is produced by exposure patterning composite piezoelectric film 30, it is necessary that matrix 31 is formed of a resin having photosensitivity which, when the resin is subjected to exposure, causes an exposed portion of the resign to be denatured and turned into a resin having solubility or non-solubility to a predetermined liquid.

As for such resin, negative or positive resist materials that allow high definition patterning, such as SU-8 (negative resist available from MicroChem Corporation), PMER-900 (positive resist available from Tokyo Ohka Kogyo, Co., Ltd), and the like are preferably used. Further, a resin that does not have photosensitivity mixed with low-molecular substance that provides photosensitivity may be used. Such low-molecular substances may include photoreactive monomer, photo initiator, sensitizer, and the like.

In the application field of the composite piezoelectric film, a piezoelectric material excellent in the magnitude of both a piezoelectric strain constant (d constant), which is an index representing the amount of strain per unit electric field (transmission capability), and a g constant, which is an index representing a field intensity generated per unit stress (reception capability), or a material excellent in the balance between the two constants is sought. Therefore, it is preferable to use, as inorganic piezoelectric body 32, an inorganic piezoelectric body having a high d constant and a relatively low permittivity which does not cause considerable degradation in g constant.

As for the material of inorganic piezoelectric body 32 having a high piezoelectric d constant, lead based piezoelectric materials, including lead zirconate titanate (Pb (Zr, Ti)$O_3$: PZT), may be cited as examples. But, lead is a highly poisonous element and environmental problems, such as flowing out of lead from waste materials during the manufacturing process or from a material in use, soil and air pollution arising from disposition of the material after use, are unavoidable. It is, therefore, preferable to use a non-lead based material.

After repeated study of material design for a non-lead based perovskite oxide that shows a high piezoelectric performance, the present inventors have found, for the first time, a composition in the non-lead based perovskite oxide that shows a piezoelectric performance comparable to that of the lead based perovskite oxide. Hereinafter, inorganic piezoelectric body 32 to be used in piezoelectric composite 1 of the present invention will be described, including the material design method.

Piezoelectric strains may include the following:

(i) an ordinary piezoelectric strain in which expansion or contraction occurs in a direction of applied electric field when the vector component of spontaneous polarization axis corresponds to the direction of applied electric field according to the increase or decrease in applied electric field intensity (intrinsic piezoelectric strain);

(ii) a piezoelectric strain produced by increasing or decreasing the electric field intensity and reversibly rotating the polarization axis by non-180°;

(iii) a piezoelectric strain caused by the change in volume due to crystal phase transitions induced by increasing or decreasing the electric field intensity; and (iv) a piezoelectric strain that makes use of engineered domain effect, which is capable of providing a larger strain, obtained by using a material having a property to cause phase transitions by the application of an electric field and forming a crystal orientation structure containing a ferroelectric phase having crystal orientation in a direction different from the spontaneous polarization direction (when making use of the engineered domain effect, the piezoelectric body may be driven under the condition in which phase transitions occur or under the condition in which phase transitions do not occur).

The piezoelectric strain in (i) above is an intrinsic piezoelectric strain, while the piezoelectric strains in (ii) to (iv) are extrinsic piezoelectric strains. In each of the piezoelectric strains described in (i) to (iv) above, a large piezoelectric strain may be obtained by forming the piezoelectric body to have a composition and a crystal orientation structure according to the strain generation mechanism. The piezoelectric strains described in (i) to (iv) above may be used individually or in combination.

It is reported that, in bulk ceramics of a lead based perovskite oxide having a MPB composition, there is a correlation between the piezoelectric strain constant (d constant) and the difference $|M_A-M_B|$ between average atomic weight of A-site elements $M_A$ and average atomic weight of B-site elements $M_B$, and the greater the $|M_A-M_B|$, the higher the electromechanical coupling coefficient k and the d constant (Y. Hosono and Y. Yamashita, "High-Efficiency Piezoelectric Single Crystals", Toshiba Review, Vol. 59, No. 10, p. 41, 2004). The present inventors have found that there is a correlation identical to that described above also in non-lead based perovksite oxides.

Thus, it can be said that a piezoelectric body having a better piezoelectric strain constant might be obtained by selecting A-site elements and B-site elements such that $|M_A-M_B|$ becomes large. For example, an element having a mass $M_A$ as large as possible may be selected as an A-site element and an element having a mass $M_B$ as small as possible may be selected as a B-site element. Judging from the value of $|M_A-M_B|$ of the lead-based perovskite oxide described in the literature described above, it is preferable that the value of $|M_A-M_B|$ is greater than 145.

In perovskite oxides, elements that can enter into the A-site are almost limited by the ion radius and ionic valence.

The present inventors have reported, in U.S. Patent Application Publication No. 20100103226, that a high value of electromechanical coupling coefficient $k_{33}$ and excellent piezoelectric performance are achieved in non-lead perovskite oxide by designing the composition to become morphotropic phase boundary (MPB) or near MPB in a Bi-based (atomic weight of 209.0) perovskite oxide. The term "near MPB" as used herein refers to a range in which a phase transition occurs when an electric field is applied.

The present inventors have assumed that the contribution of the mass difference between the A-site element and B-site element to the piezoelectric performance is not limited to the MPB composition and exists in other compositions in no small part, and have found that a high d constant can be realized for a non-lead piezoelectric body using Bi (209.0) (the value in parentheses represents atomic weight) as an A-site element having a large mass that allows the designing such that the $|M_A-M_B|$ exceeds 145 and, more specifically, by providing the non-lead piezoelectric body as a perovskite oxide, which may include an unavoidable impurity, having a composition represented by General Formula (PX) below.

$$(Bi_x, A_{1-x})(B_y, C_{1-y})O_3 \quad (PX)$$

(where, A is an A-site element, other than Pb, with an average ionic valence of two, B is a B-site element with an average ionic valence of three, C is a B-site element with an average ionic valence of greater than three, in which each of A, B, C is one or a plurality of kinds of metal elements. O represents oxygen. B and C have different compositions. $0.6 \le x \le 1.0$, $x-0.2 \le y \le x$. Although the ratio of a total mole number of the A-site element or of the B-site element to a mole number of the oxygen atoms is normally 1:3, the ratio may deviate from 1:3 within a range in which a perovskite structure can be obtained.)

As indicated in Formula (PX), A-site element may be only Bi or the A-site may also include A-site element A other than Pb with an average ionic valence of two. Preferably, the A-site element A is at least one kind of metal element selected from the group consisting of Mg, Ca, Sr, Ba, (Na, Bi), and (K, Bi).

As the major A-site element (60 mol % or more) is Bi with an average ionic valence of three, the B-site element B is a metal element with an average ionic valence of three which is preferable to have a small mass. As for such B-site element, at least one kind of metal element selected from the group consisting of Al, Sc, Cr, Mn, Fe, Co, Ni, Cu, Ga, Y, In, and Re (rare earth element) may be cited.

Where A-site element A is included, it is preferable that a metal element with an average ionic valence of four is included, as the B-site element C, in the same mole number as that of the A-site element A, since the average ionic valence of element A is two. If the mole number of the B-site element C is greater than that of the A-site element A, the B-site element C functions as a donor dopant, but it may be included up to 20%. The B-site element C may include an element having an average ionic valence of greater than four. In this case, the element C with an average ionic valence of greater than four functions as a donor dopant even when it is included in the same mole number as that of the element A. The B-site element C as a dopant may be included up to 20%. Where A-site element A is not included, the B-site element C functions as a donor dopant when the average ionic valence thereof is four or greater. As for the B-site element C as a dopant, Nb, Mn, or the like is preferably used.

In the application field of the composite piezoelectric film described above, it is preferable that the composite piezoelectric film has a high piezoelectric d constant and a relatively low permittivity which does not cause considerable degradation in g constant. Preferably, inorganic piezoelectric body 32 formed of a perovskite oxide represented by General Formula (PX) above has such a composition that a piezoelectric strain constant $d_{33}$ (pm/V) and a relative permittivity $\epsilon_{33}$ satisfy Formulae (1) and (2) below.

$$100 < \epsilon_{33} < 1500 \quad (1)$$

$$d_{33}(pm/V) > 12\sqrt{\epsilon_{33}} \quad (2)$$

Generally, the piezoelectric strain constant $d_{33}$ (pm/V) and relative permittivity $\epsilon_{33}$ in the longitudinal vibration mode of the ordinary electric field induced piezoelectric strain in (i) above (intrinsic piezoelectric strain; true piezoelectric strain) are in the relationship of $d_{33}=k_{33}\sqrt{s}\sqrt{\epsilon_0}\sqrt{\epsilon_{33}}$, and it is known that the power output constant $g_{33}$ may be calculated as $g_{33}=d_{33}/\epsilon_0\epsilon_{33}$. That is, in the intrinsic piezoelectric strain, it is known that, when $\alpha=k_{33}\sqrt{s}\sqrt{\epsilon_0}$, $d_{33}$ is proportional to $\sqrt{\epsilon_{33}}$ while $g_{33}$ is inversely proportional to $\sqrt{\epsilon_{33}}$ ($k_{33}$ is the electromechanical coupling coefficient, $\epsilon_0$ is the vacuum permittivity (N/V²), and s is the elastic compliance (m²/N)).

Figure 3:
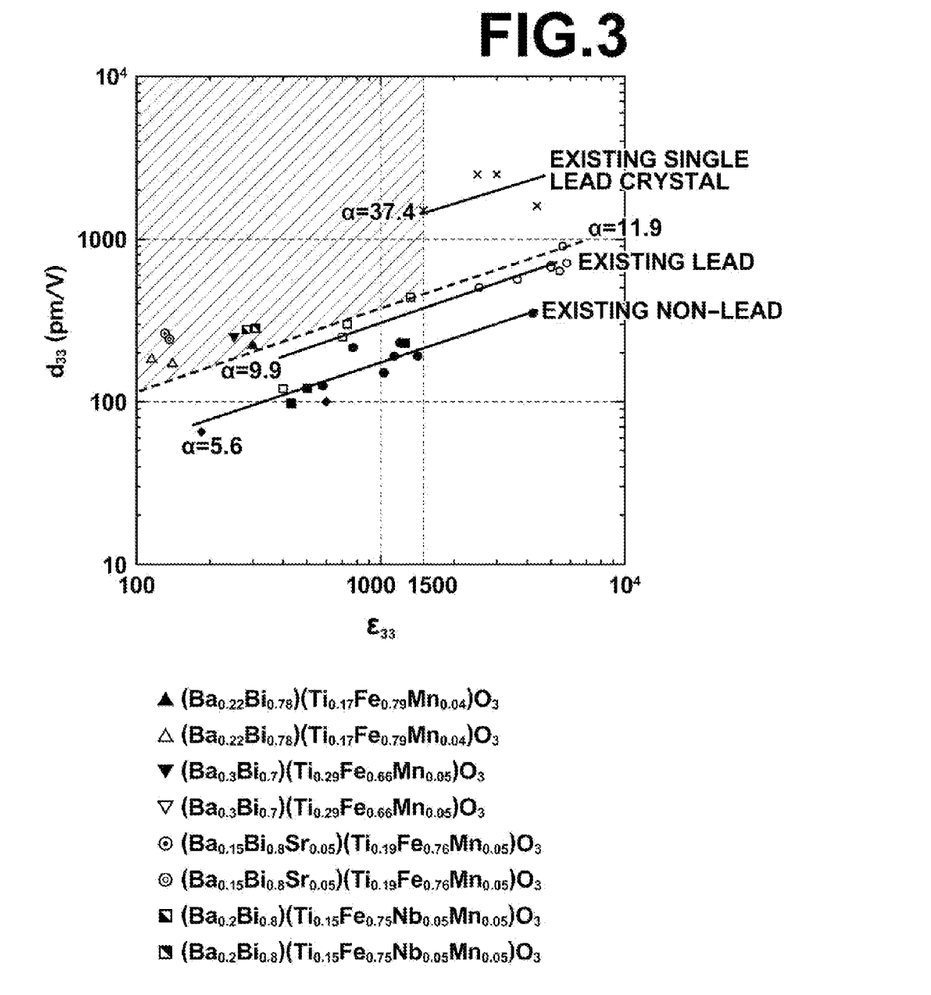
FIG. 3 illustrates a relationship between the permittivity and piezoelectric strain constant of a non-lead based piezoelectric device of the present invention and existing piezoelectric devices formed of lead-based and non-lead based materials.

Further, in the known lead based or non-lead based materials which have been developed so far and those capable of providing high intrinsic piezoelectric strains which have been invented and disclosed by the present inventors, it is confirmed that $d_{33}$ is substantially proportional to $\sqrt{\epsilon_{33}}$ (FIG. 3).

Figure 4:
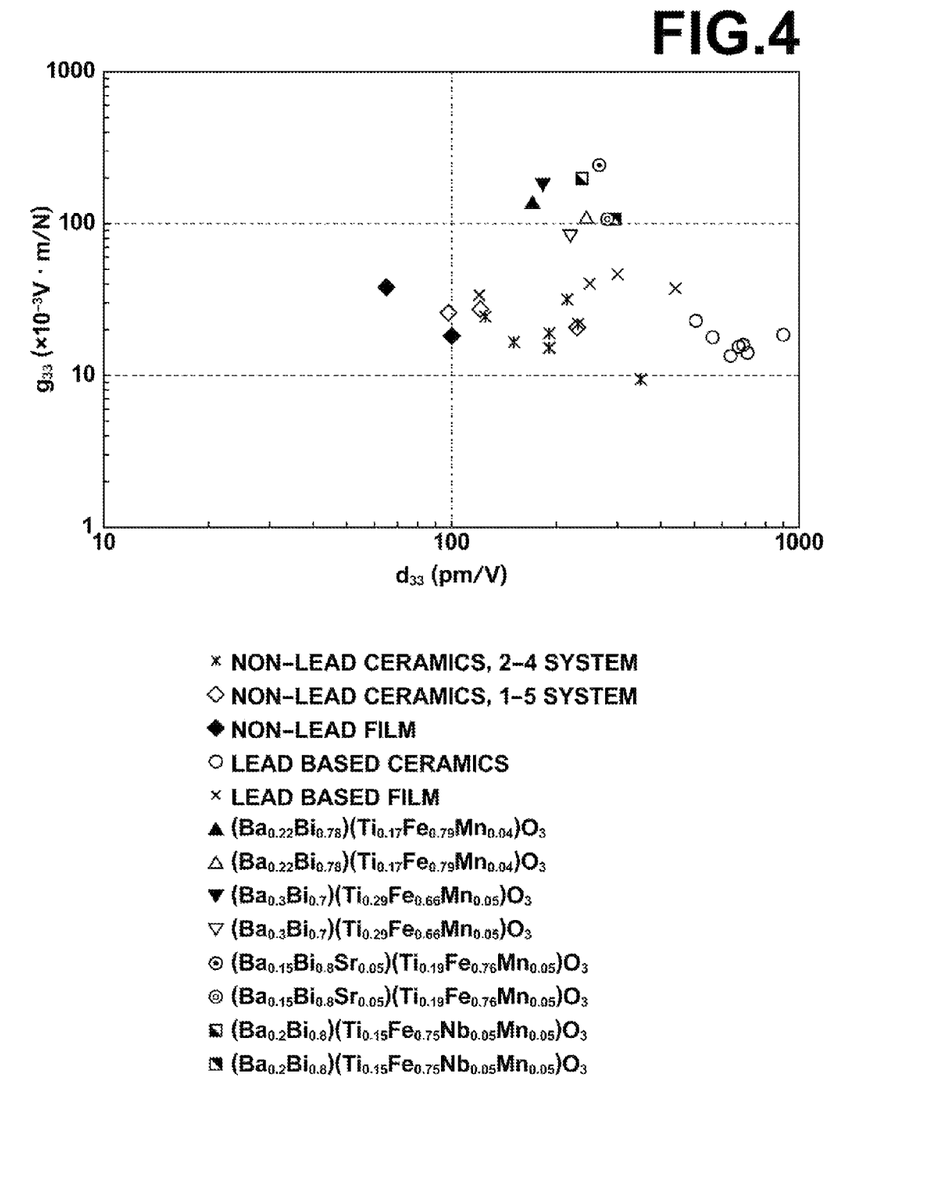
FIG. 4 illustrates a relationship between the piezoelectric strain constant and voltage output constant of a non-lead based piezoelectric device of the present invention and existing piezoelectric devices formed of lead-based and non-lead based materials.

After studying composition, manufacturing method, crystal orientation, and the like, the present inventors have succeeded in obtaining a piezoelectric body which satisfies Formulae (3) and (4) below and is excellent in both $d_{33}$ and $g_{33}$ values, that is, excellent in both transmission and reception capabilities, by forming, as inorganic piezoelectric body 32, a piezoelectric body which, while having the same permittivity $\epsilon_{33}$, has a larger $d_{33}$ value in comparison with conventional materials, deviating largely from linear lines shown in FIG. 3, that is, by forming a piezoelectric body that satisfies Formulae (1) and (2) above (FIG. 4; compositions are shown in FIG. 4; for detail, refer to Japanese Patent Application No. 2009-162423).

$$100 < d_{33} \text{ (pm/V)} \quad (3)$$

$$80 < g_{33} \text{ (} \times 10^{-3} \text{ V·m/N)} \quad (4)$$

(where, $g_{33}$ is the voltage output constant (piezoelectric sensitivity constant) of the piezoelectric body described above).

As described above, as the mass difference $|M_A - M_B|$ between A-site ions and B-site ions is increased in the perovskite oxide, so does the electromechanical coupling coefficient $k_{33}$ and d constant. In the mean time, the value of s is an inverse number of Young's modulus and it is, therefore, possible to improve the performance to a certain extent by selecting a material having a comparatively low Young's modulus, but the value range is fixed in a way by usable materials. Therefore, in order to increase the value of $d_{33}$ without increasing the relative permittivity, it is preferable to increase the value of $k_{33}$.

For example, in General Formula (PX) above, inclusion of $BaTiO_3$ and $BiFeO_3$ as the first and second components respectively allows the d constant to be increased without largely increasing the relative permittivity. The crystal system of $BaTiO_3$ is rhombohedral and the crystal system of $BiFeO_3$ is tetragonal, so that a perovskite oxide which includes the two components may form an MPB composition. Therefore, a high d constant may be realized using the piezoelectric strain of (iii) or (iv) above.

In order to obtain the MPB composition, it is necessary to form a composition that satisfies Formula (5) below. Further, it is more preferable that a third component D that satisfies Formula (6) below is included. It is further preferable that the third component D satisfies Formula (7) below.

$$0.97 \leq TF(PX) \leq 1.02 \quad (5)$$

$$TF(BiFeO_3) < TF(D) < TF(BaTiO_3) \quad (6)$$

$$0.97 \leq TF(D) \leq 1.02 \quad (7)$$

(where, TF(PX) is a tolerance factor of the perovskite oxide represented by General Formula (PX) above; $TF(BiFeO_3)$, TF(D), and $TF(BaTiO_3)$ are tolerance factors of the oxides in parentheses respectively.)

Figure 5:
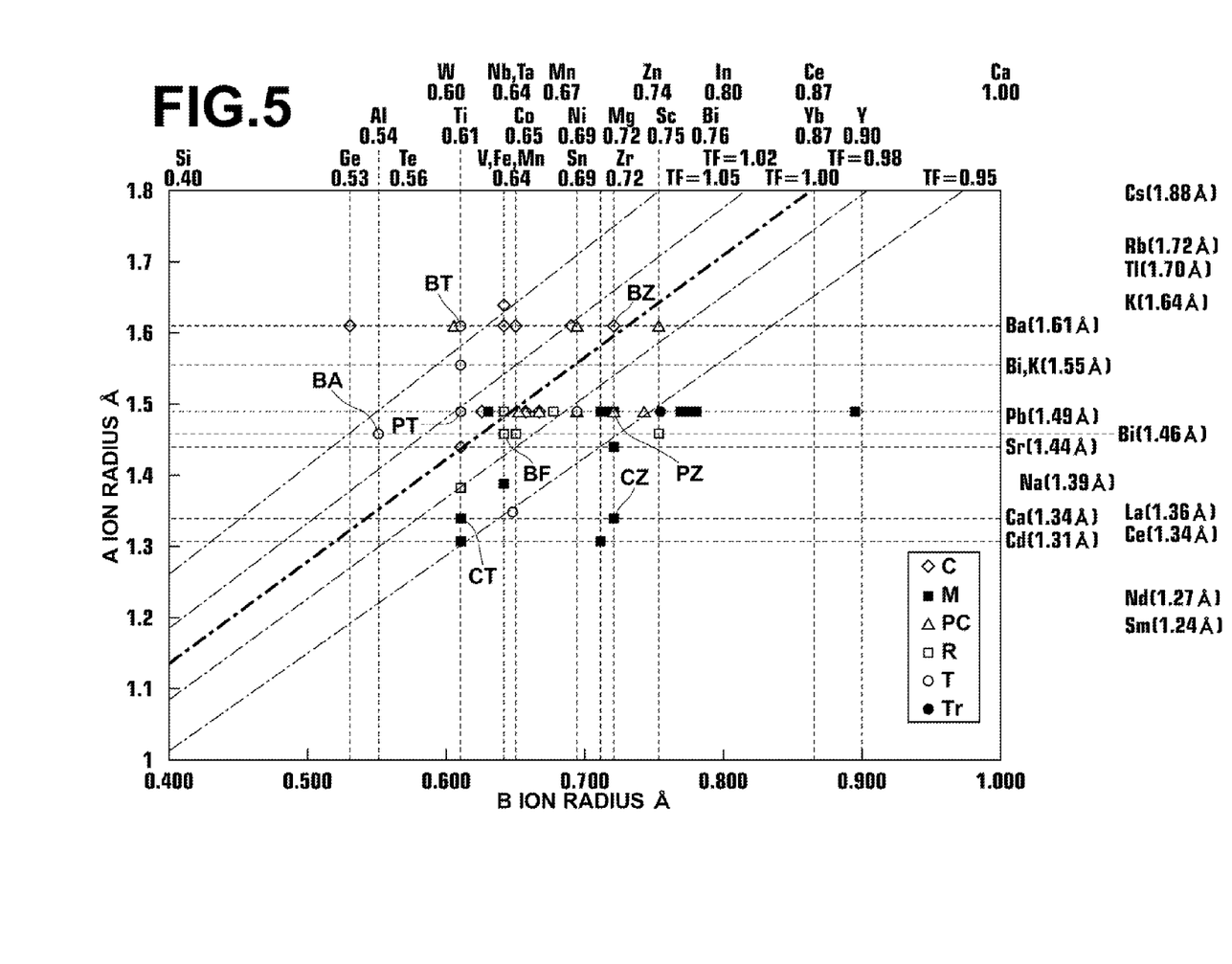
FIG. 5 illustrates a relationship among the ion radius of an A-site element, ion radius of a B-site element, a tolerance factor TF, and a crystal system with respect to various perovskite oxides.

FIG. 5 illustrates the relationship among the average ion radius of A-site elements, average ion radius of B-site elements, tolerance factor TF, and crystal system with respect to each of various perovskite oxides in which A-site includes one or two elements and B-site includes one or two elements. In the drawing, the following symbols represent the following crystal systems: C=cubic crystal; M=monoclinic crystal; PC=pseudocubic crystal; R=rhombohedral crystal; T=tetragonal crystal; and Tr=trigonal crystal. Two types of Mn are shown in FIG. 5 in which 0.64 Å indicates the ion radius of trivalent Mn and 0.67 Å indicates the ion radius of bivalent Mn.

The perovskite crystal lattice becomes close packed when TF=1.0. Under this condition, the B-site element does not substantially move in the crystal lattice and is likely to take a stable structure. With this composition, the peroviskite type oxide is likely to take a crystal structure, such as cubic crystal or pseudocubic crystal, and does not show ferroelectricity or may show ferroelectricity with an extremely low level.

The B-site element is small with respect to the A-site element when TF>1.0. Under this condition, the B-site element is likely to enter into the crystal lattice even when the crystal lattice is not distorted and movable within the crystal lattice. With this composition, the peroviskite type oxide is likely to take a crystal structure, such as tetragonal crystal (with spontaneous polarization axis in <001> direction) or the like, and has ferroelectricity. The level of the ferroelectricity tends to be increased as the TF value deviates from 1.0.

The B-site element is large with respect to the A-site element when TF<1.0. Under this condition, the B-site element does not enter the crystal lattice unless the crystal lattice is distorted. With this composition, the peroviskite type oxide is likely to take a crystal structure, such as orthorhombic crystal (with spontaneous polarization axis in <110> direction) or rhombohedral crystal (with spontaneous polarization axis in <111> direction), and has ferroelectricity. The level of the ferroelectricity tends to be increased as the TF value deviates from 1.0.

Table 1 summarizes, with respect to each of various mixed crystals of first components with TF>1.0 and second components with TF<1.0, crystal system/A-site ion radius/B-site ion radius/TF/ratio (molar ratio) between the first and second components that forms morphotropic phase boundary (MPB) composition of each separate component, and A-site average ion radius/B-site average ion radius/TF of each of mixed crystals of first and second components having MPB compositions. In Table 1, the following symbols represent the following crystal systems: T=tetragonal crystal; O=orthorhombic crystal; and R=rhombohedral crystal.

As shown in Table 1, TF values of PMB compositions fall within the range from 0.97 to 1.02. Therefore, a composition that satisfies $0.97 \leq TF(PX) \leq 1.02$ - - - (5) allows inorganic piezoelectric body 32 to have an MPB composition or a near MPB composition.

TABLE 1

| | | TF > 1 | | | | | TF < 1 | | | | | MPB | | |
|---|---|---|---|---|---|---|---|---|---|---|---|---|---|---|
| | | Crystal System | A-site Ion Radius | B-site Ion Radius | TF | Ratio | | Crystal System | A-site Ion Radius | B-site Ion Radius | TF | Ratio | A-site Ion Radius | B-site Ion Radius | TF |
| PT-PZ | $PbTiO_3$ | T | 1.49 | 0.605 | 1.019 | 0.48 | $PbZrO_3$ | R | 1.49 | 0.72 | 0.964 | 0.52 | 1.49 | 0.66 | 0.990 |
| PT-PS | $PbTiO_3$ | T | 1.49 | 0.605 | 1.019 | 0.45 | $PbSnO_3$ | R | 1.49 | 0.69 | 0.978 | 0.55 | 1.49 | 0.65 | 0.996 |
| PT-BiS | $PbTiO_3$ | T | 1.49 | 0.605 | 1.019 | 0.65 | $BiScO_3$ | R | 1.46 | 0.745 | 0.943 | 0.35 | 1.48 | 0.65 | 0.991 |
| BT-BiNT | BT | T | 1.61 | 0.605 | 1.062 | 0.15 | $(Bi, Na)TiO_3$ | R | 1.425 | 0.605 | 0.996 | 0.85 | 1.45 | 0.61 | 1.006 |
| BT-BiNT | BT | T | 1.61 | 0.605 | 1.062 | 0.07 | $(Bi, Na)TiO_3$ | R | 1.425 | 0.605 | 0.996 | 0.93 | 1.44 | 0.61 | 1.001 |
| BT-BiNT | $(Bi, K)TiO_3$ | T | 1.55 | 0.605 | 1.041 | 0.20 | $(Bi, Na)TiO_3$ | R | 1.425 | 0.605 | 0.996 | 0.80 | 1.45 | 0.61 | 1.005 |
| KN-NN | $KNbO_3$ | O | 1.64 | 0.64 | 1.054 | 0.49 | $NaNbO_3$ | O | 1.39 | 0.64 | 0.967 | 0.51 | 1.51 | 0.64 | 1.010 |

The TF value of the first component, $BaTiO_3$, is 1.059, while the TF value of the second component, $BiFeO_3$, is 0.989, that is, a first component with TF>1.0 and a second component with TF<1.0 are included. This shows that a system which includes the two components may form an MPB. Therefore, a perovskite oxide having an MPB composition may be obtained by adjusting the composition ratio between the two components or by adjusting the composition ratio by further adding a third component D in General Formula (PX).

Specific examples of the third component D may include La, Ca, Sb, Bi, Si, Sr, and the like for A-site element, and Nd, Nb, Ta, Cr, Fe, Sc, and the like for B-site element.

For example, $SrTiO_3$ may be cited as the third component. $SrTiO_3$ has a TF value of 1.002 which is nearly 1.0 (within the range from 0.97 to 1.01), so that addition of $SrTiO_3$ to $BaTiO_3$ and $BiFeO_3$ may cause the overall TF to fall within the range from 0.97 to 1.01. $CaTiO_3$, other than $SrTiO_3$, is also preferably used as the third component.

It is known that electrical property is improved by adding a dopant to A-site and B-site. Preferable elements as the dopant include meatal ions, such as Mg, Ca, Sr, Ta, W, and Ln (lanthanide elements (La, Ce, Pr, Nd, Sm, Eu, Gd, Tb, Dy, Ho, Er, Tm, Yb, and Lu) other than Nb and Mn already described. Further, a creation element forming the third component may function as the dopant of each site.

$BiFeO_3$ is known as a material having a high Curie temperature. Accordingly, as the $BiFeO_3$ component is increased in General Gormula (PX), so is the Curie temperature of inorganic piezoelectric body 32. Therefore, the usability of the inorganic piezoelectric body 32 under a high temperature environment is increased and the thermal stability thereof under room temperature is enhanced.

The perovskite oxide described above may have a three phase mixed crystal structure in which the three components, $BaTiO_3$, $BiFeO_3$, and a third component coexist, or a single-phase structure in which the three components, $BaTiO_3$, $BiFeO_3$, and the third component are completely solid solved into a single phase. Further, the perovskite oxide may have another structure.

Preferably, the crystal system of the third component is the cubic crystal system or pseudocubic crystal system. The perovskite oxide having the three phase mixed crystal structure of the first to third components described above is an effective material for an electric field induced phase transition system proposed by the present inventors in U.S. Pat. No. 7,845,767, in which the present inventors have found that a high piezoelectric performance can be obtained.

When $BaTiO_3$ and $BiFeO_3$ are included, and is prepared to have a near MPB composition, inorganic piezoelectric body 32 may become a piezoelectric device that satisfies Formulae (3) and (4) above and has both high d and g constants. As described above, piezoelectric composite 1 uses, as inorganic piezoelectric body 32, a piezoelectric body formed of a perovskite oxide (which may include an unavoidable impurity) having a composition represented by General Formula (PX) above. Such perovskite oxides are found by the present inventors, for the first time in non-lead based perovskite oxides, as compositions having a high piezoelectric performance comparable to that of lead based perovskite oxides, which has been resulted from the invention of the material design method made by the present inventors for a non-lead based perovskite oxide having a high piezoelectric performance (d constant). Further, such perovskite oxides have a high Curie temperature and are excellent in thermal stability. Thus, according to the present embodiment, non-lead based composite piezoelectric film 30 having a favorable piezoelectric performance and excellent thermal stability may be provided.

Further, the present inventors have found a composition excellent in both d and g constants in the material design. Consequently, the use of inorganic piezoelectric body 32 formed of a perovskite oxide (which may include an unavoidable impurity) having a composition excellent in both d and g constants allows composite piezoelectric film 30 which is excellent in both the magnitude and the balance of d and g constants with an unprecedented high performance to be realized.

Composite piezoelectric film 30 may include an additive agent. For example, in damper applications, conductive fine particles, such as carbon blacks, carbon nanotubes, metal particles, and the like are included to adjust the electrical conductivity of the piezoelectric composite. This allows a series circuit of the piezoelectric film and the conductive fine particles to be formed and vibration energy is efficiently converted to thermal energy. The additive agent is not limited to the conductive material, and any additive material having a desired property for the application may be used.

There is not any specific restriction on the film forming method of composite piezoelectric film 30, and the composite piezoelectric film may be formed by a solution film forming method, such as a casting method, or a melt film forming method, such as T-die film forming method. In the case of solution film forming method, if inorganic piezoelectric body 32 has an anisotropic shape, such as a whisker shape or a fiber shape, a long axis direction of inorganic piezoelectric body 32 may be easily oriented to an application direction of the solution.

Preferably, poling is performed on composite piezoelectric film 30. Provision of a structure in which anisotropic inorganic piezoelectric bodies 32 are oriented unidirectionally is preferable as it may yield an orientation-based high piezoelectric performance (d constant).

Layered structure 1 has a configuration that includes composite piezoelectric film 30 formed on resin substrate 10 and constituted by organic polymer resin matrix 31 and a plurality of inorganic piezoelectric bodies 32 dispersed in the matrix. As such configuration includes, as the piezoelectric film, composite piezoelectric film 30 constituted by flexible organic polymer resin 31 and inorganic piezoelectric bodies 32 that show an excellent piezoelectric performance dispersed in the resin, layered structure 1 may provide flexible piezoelectric device 2 with an excellent piezoelectric performance.

Layered structure 1 (1') may be obtained by forming piezoelectric film 30 on resin substrate 10 without using an adhesive, and each of the substrate and piezoelectric film include a resin, so that detachment or cracking due to an external force, such as bending, is unlikely to occur in piezoelectric film 30. Consequently, layered structure 1 of the present invention may provide highly reliable piezoelectric device 2.

When a configuration is adopted in which a photosensitive resin, such as a photoresist resin, is used as the organic polymer resin, high definition patterning can be achieved. Thus, in the manufacture of an arrayed device, such as a sensor array or the like, a high definition array can be realized, whereby a high performance flexible arrayed piezoelectric device with little cross-talk may be provided.

Further, if a configuration is adopted in which a piezoelectric body formed of a pervskite oxide having a composition represented by General Formula (PX) above (which may include an unavoidable impurity) is used as inorganic piezoelectric body 32, non-lead based flexible piezoelectric device 2 excellent in piezoelectric performance and thermal stability at room temperature may be provided.

Piezoelectric device 2 may be preferably used as a variety of sensors, such as ultrasonic sensors, pressure sensors, antenna sensors, strain sensors, and the like, ultrasonic probes, ultrasonic transducers, such as hydrophones and the like, dampers used for vehicles, building, or sport equipment, such as skis, rackets, and the like, and vibration power generators used by applying to floors, shoes, tires, and the like.

EXAMPLES

Examples of the present invention will now be described.

Example 1

First, as basic ingredients, $BaTiO_3$, $Bi_2O_3$, and $Fe_2O_3$ were blended to obtain a composition of $(Ba_{0.2}, Bi_{0.8})(Ti_{0.2}, Fe_{0.80})O_3$. At that time, $Bi_2O_3$ was in excess by 0.5 mol %. The blended raw material powder was wet mixed in ethanol by a ball mill to prepare a mixed powder. After mixing, the mixed powder was shaped by drying and subjected to calcination at 750° C. for three hours. Thereafter, it is crushed and subjected to press molding.

Figure 6:
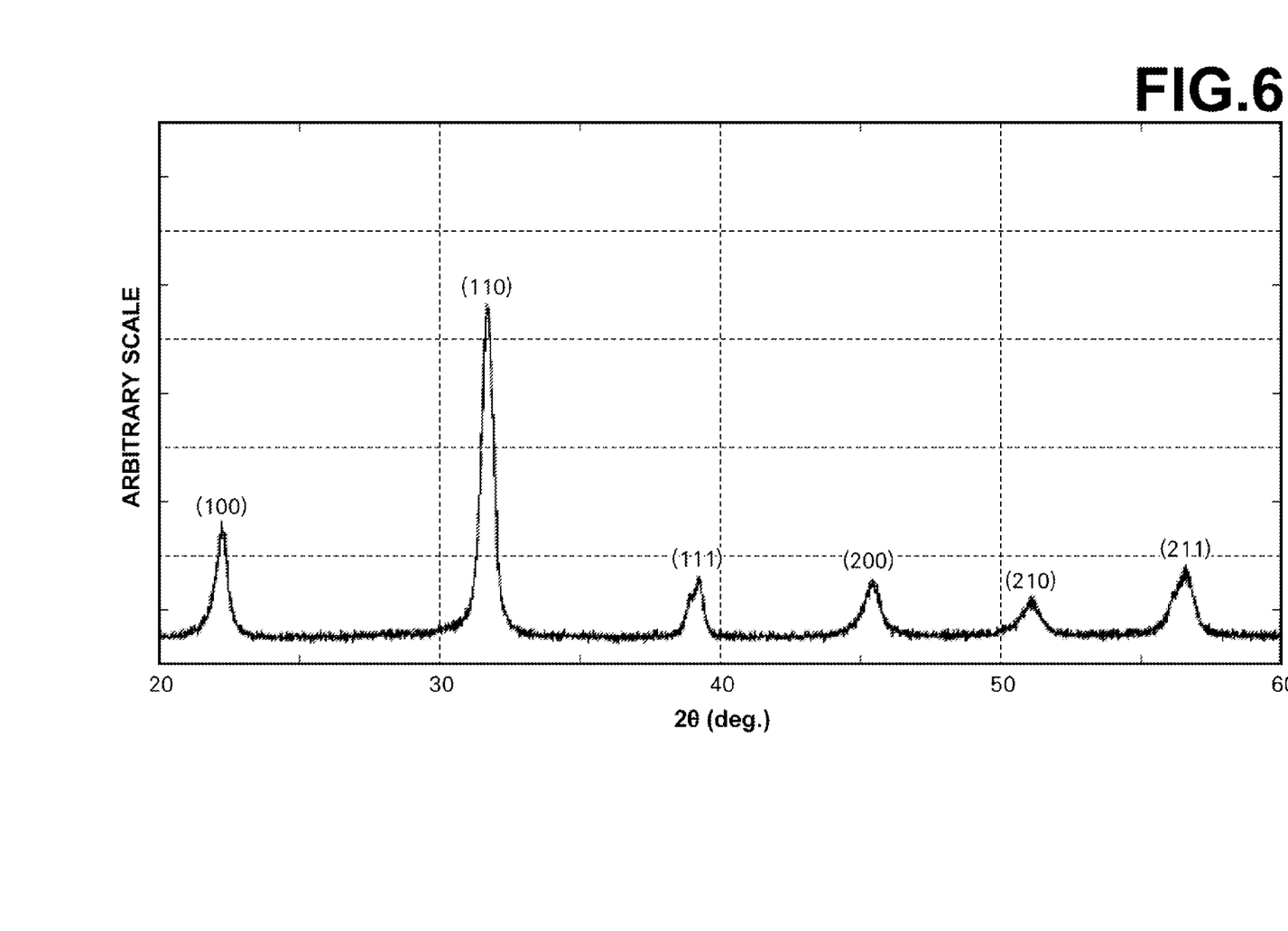
FIG. 6 illustrates an XRD spectrum of piezoelectric ceramics powder of Example 1.
Figure 7:
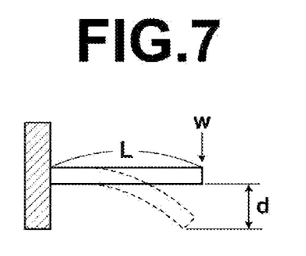
FIG. 7 illustrates a method of measuring flexibility of a substrate.

The obtained compact was baked at 930° C. for ten hours, then crushed, and screened by a 400 mesh (μm) screen to obtain piezoelectric ceramics powder. The composition of the obtained powder was measured by ICP and it was confirmed to be the target composition. Also, it was confirmed that the obtained powder has a perovskite single phase (FIG. 6).

Then, SU-8 negative type resist was provided and the obtained ceramics powder was added to the resist by about 50 vol. %, which was then sufficiently mixed by a mixing mill. The obtained mixture was coated by a spin coating method on the entire surface of a polyimide film (50 μm thick) with a 10 μm thick Cu film applied thereon, whereby a composite piezoelectric film layer structure was obtained.

Thereafter, the composite piezoelectric film was patterned in a predetermined pattern (30 mm×30 mm) through an ordinary photolithography process and a silver paste was coated on the composite piezoelectric body as the upper electrode, whereby a piezoelectric device was produced.

The obtained piezoelectric device was subjected to poling and, as measurement samples, permittivity and piezoelectric constant $d_{33}$ were measured. The permittivity was measured by an impedance analyzer (4294A/Agilent Technologies), while the piezoelectric constant $d_{33}$ was measured by a $d_{33}$ meter (PM300/Piezotest). The measured permittivity was 31 and measured piezoelectric constant $d_{33}$ was 35 pC/N. The measurements were conducted again after bending the piezoelectric device with a bending radius of 20 mm, but these values did not change.

The polymer composite piezoelectric body of the present invention may be preferably used as a variety of sensors, such as infrared sensors, ultrasonic sensors, pressure sensors, antenna sensors, strain sensors, and the like, or sensor arrays, patterned memories, ultrasonic probes, ultrasonic transducers, such as hydrophones and the like, dampers used for vehicles, building, or sport equipment, such as skis, rackets, and the like, and vibration power generators used by applying to floors, shoes, tires, and the like.

What is claimed is:

1. A layered structure, comprising:
   a resin substrate; and
   a composite piezoelectric film formed on the substrate and constituted by an organic polymer resin matrix and a plurality of inorganic piezoelectric bodies dispersed in the matrix,
   wherein the inorganic piezoelectric body is comprised of a perovskite oxide having a composition represented by the following General Formula (PX):

$$(Bi_x, A_{1-x})(B_y, C_{1-y})O_3 \quad \text{(PX)},$$

where A is an A-site element other than Pb, and the A-site element having an average ionic valence of two, B is a B-site element with an average ionic valence of three, C is a B-site element with an average ionic valence of greater than three, and each of A, B, C is one or a plurality of kinds of metal elements, and O represents oxygen, and B and C have different compositions, and $0.6 \leq x \leq 1.0$ and $x-0.2 \leq y \leq x$, and although the ratio of a total mole number of the A-site element or of the B-site element to a mole number of the oxygen atoms is normally 1:3, the ratio may deviate from 1:3 within a range in which a perovskite structure can be obtained, and
   wherein the A-site element A is at least one kind of metal element selected from the group consisting of Mg, Ca, Sr, Ba, (Na, Bi), and (K, Bi), and
   wherein the B-site element B is at least one kind of metal element selected from the group consisting of Al, Sc, Cr, Mn, Fe, Co, Ni, Cu, Ga, Y, In, and Re (rare earth element), and
   wherein a piezoelectric strain constant $d_{33}$ (pm/V) and a relative permittivity $\epsilon_{33}$ of the inorganic piezoelectric body satisfy the following Formulae (1) and (2):

$$100 < \epsilon_{33} < 1500 \quad (1)$$

$$d_{33}(pm/V) > 12\sqrt{\epsilon_{33}} \quad (2).$$

2. The layered structure of claim 1, wherein the organic polymer resin is a resin having photosensitivity which, when the resin is subjected to exposure, causes an exposed portion of the resin to be denatured and turned into a resin having solubility or non-solubility to a predetermined liquid.

3. The layered structure of claim 1, wherein the piezoelectric strain constant $d_{33}$ and the voltage output constant $g_{33}$ of the inorganic piezoelectric body satisfy the following Formulae (3) and (4):

$$100 < d_{33} (pm/V) \quad (3)$$

$$80 < g_{33}(\times 10^{-3} V \cdot m/N) \quad (4)$$

4. The layered structure of claim 1, wherein the perovskite oxide includes $BaTiO_3$ as a first component with a tolerance factor of greater than 1.0 and $BiFeO_3$ as a second component with a tolerance factor of smaller than 1.0.

5. The layered structure of claim 1, wherein the perovskite oxide represented by General Formula (PX) includes a first component with a tolerance factor of greater than 1.0 and a second component with a tolerance factor of smaller than 1.0, and satisfies the following Formula (5):

$$0.97 \leq TF(PX) \leq 1.02 \quad (5)$$

(where TF(PX) is a tolerance factor of the perovskite oxide represented by General Formula (PX).

6. The layered structure of claim 1, wherein a difference $|M_A - M_B|$ between an average atomic weight $M_A$ of the A-site elements and an average atomic weight $M_B$ of the B-site elements is greater than 145.

7. The layered structure of claim 1, wherein the composite piezoelectric film constitutes at least a portion of each of a plurality of protrusions formed protruding from a substrate surface of the substrate.

8. A piezoelectric device, comprising the layered structure of claim 1.

* * * * *